United States Patent
Jeon et al.

(10) Patent No.: US 8,404,080 B2
(45) Date of Patent: Mar. 26, 2013

(54) APPARATUS TO TREAT A SUBSTRATE

(75) Inventors: Sang-jean Jeon, Suwon-si (KR); Jong-rok Park, Seoul (KR); Sung-yeup Sa, Suwon-si (KR); Hee-jeon Yang, Suwon-si (KR); Guen-suk Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1818 days.

(21) Appl. No.: 11/417,043

(22) Filed: May 4, 2006

(65) Prior Publication Data
US 2007/0017446 A1 Jan. 25, 2007

(30) Foreign Application Priority Data

Jul. 22, 2005 (KR) .................. 10-2005-0066915

(51) Int. Cl.
*C23C 16/00* (2006.01)
*H01L 21/306* (2006.01)
(52) U.S. Cl. .................. 156/345.48; 118/723 I
(58) Field of Classification Search ............ 118/723 I, 118/723 IR, 723 AN; 156/345.48, 345.49; 315/111.51
See application file for complete search history.

(56) References Cited

U.S. PATENT DOCUMENTS

| 5,683,548 A | 11/1997 | Hartig et al. |
| 5,710,486 A | 1/1998 | Ye et al. |
| 5,944,942 A * | 8/1999 | Ogle .................. 156/345.46 |
| 6,204,607 B1 | 3/2001 | Ellingboe |

FOREIGN PATENT DOCUMENTS

| JP | 2000-510643 | 8/2000 |
| JP | 2002-507823 | 3/2002 |
| JP | 2004-342612 | 12/2004 |
| KR | 2005-449 | 1/2005 |

OTHER PUBLICATIONS

Chinese Office Action issued Dec. 26, 2008 in Chinese Application No. 2006101063249.
Korean Office Action dated Jun. 18, 2009 issued in KR 2006-194848.

* cited by examiner

*Primary Examiner* — Luz L. Alejandro
(74) *Attorney, Agent, or Firm* — Stanzione & Kim, LLP

(57) ABSTRACT

An apparatus to treat a substrate includes a processing chamber including a reaction space where a substrate to be treated is placed and a plasma is formed, a ferrite core having a plurality of poles disposed outside the reaction space and a connector facing the reaction space across the plurality of poles and connecting the plurality of the poles each other, a coil winding around the plurality of poles, and an electric power unit supplying electric power to the coil.

25 Claims, 10 Drawing Sheets

APPARATUS TO TREAT A SUBSTRATE

CROSS-REFERENCE TO RELATED APPLICATIONS

This application claims the priority of Korean Patent Application No. 2005-0066915, filed on Jul. 22, 2005, in the Korean Intellectual Property Office, the disclosure of which is incorporated herein by reference.

BACKGROUND OF THE INVENTION

1. Field of the Invention

The present general inventive concept relates to an apparatus to treat a substrate, and more particularly, to an apparatus to treat a substrate using a ferrite core to improve plasma-generating efficiency.

2. Description of the Related Art

A substrate for a semiconductor wafer or a display apparatus (hereinafter, referred to as "substrate") is manufactured by performing repeated deposition and etching processes of a thin film.

FIG. 1 is a sectional view illustrating an apparatus to treat a substrate using a ferrite core, and FIG. 2 is a plane view illustrating the apparatus of FIG. 1.

Referring to FIGS. 1 and 2, a conventional apparatus to treat a substrate comprises an upper container 111 and a lower container 112 which are combined with each other. A space formed by both containers 111 and 112 is divided into an upper reaction space 113 and a lower reaction space 114 by partitions 121 and 122. Gas is brought in the reaction spaces 113 and 114 and ionized, thereby generating plasma. An upper chuck 131 is disposed in the upper reaction space 113 and a lower chuck 132 is disposed in the lower reaction space 114. Typically, the substrate to be treated is disposed only on the lower chuck 132. Six toroidal ferrite cores 141 are disposed circularly on the same plane in a middle of both reaction spaces 113 and 114 at a regular interval. A coil 142 winds around each ferrite core 141. The coil 142 winds around adjacent ferrite cores 141 in opposite directions, thereby making phases of an induced electromotive force generated by the adjacent ferrite cores 141 opposite.

Both reaction spaces 113 and 114 communicate with each other through a through hole 152 formed in a tube 151 passing through the center of the ferrite core 141. Reactant gas passes through the through hole 152. The through hole 152 is a passage of a discharging current. When treating the substrate, the coil 142 winding around the ferrite core 141 becomes a primary side and the plasma becomes a secondary side, and accordingly high-frequency electric power applied to the coil 142 is transmitted to the secondary side of the plasma. The phase difference of the induced electromotive force between the adjacent ferrite cores 141 is 180 degrees. The passage of the current induced in the plasma is formed in a closed circuit through two adjacent through holes 152. Arrows in FIG. 1 shows six induced currents formed between the adjacent through holes 152.

In order to improve plasma-generating efficiency, the passage of the secondary current induced in the plasma should be formed in a closed circuit. Therefore, the conventional apparatus for treating the substrate 100 comprises the two reaction spaces 113 and 114. However, only one side of the substrate is treated in the conventional apparatus for treating the substrate 100 while the plasma is generated in both sides of the substrate, thereby reducing density and efficiency of the plasma.

SUMMARY OF THE INVENTION

Accordingly, it is an aspect of the present general inventive concept to provide to an apparatus having high plasma-generating efficiency.

Additional aspects and advantages of the present general inventive concept will be set forth in part in the description which follows and, in part, will be obvious from the description, or may be learned by practice of the general inventive concept.

The foregoing and/or other aspects of the present general inventive concept may be achieved by providing an apparatus to treat a substrate comprising: a processing chamber comprising a reaction space where a substrate to be treated is disposed and a plasma is formed, a ferrite core comprising a plurality of poles disposed outside the reaction space and a connector to face the reaction space across the plurality of poles and to connect the plurality of the poles each other, a coil to wind around the plurality of poles, and an electric power unit to supply electric power to the coil.

The coil may wind around the adjacent poles in the opposite direction.

The connector may be formed in a closed loop.

The plurality of poles connected each other by the connector may be disposed in a round shape.

The plurality of poles connected to each other by the connector may be disposed at a regular distance.

The number of poles connected to each other by the connector may be even.

The connectors may be disposed in a round shape.

The connector may comprise an interior connector and an exterior connector surrounding the interior connector.

The interior connector and the exterior connector may be disposed coaxially in a round shape.

The electric power unit may supply electric power to the interior connector and the exterior connector independently.

The electric power unit may supply 100 kHz~1 MHz of electric power to one of the interior connector and the exterior connector.

The coil may be divided into two parts, and the two parts may be connected to the electric power unit in parallel.

The connectors may be disposed in a toroidal shape.

The pole may have a cylinder shape.

The electric power unit may supply 100 kHz~1 MHz of electric power.

The coil may be grounded through a capacitor.

Impedance of the capacitor may be about half of impedance of the ferrite core.

The apparatus to treat the substrate may further comprise a window plate disposed between the reaction space and the ferrite core.

The window plate may comprise alumina or quartz.

The apparatus to treat the substrate may further comprise an impedance matching unit disposed between the electric power unit and the coil.

The foregoing and/or other aspects and utilities of the present general inventive concept may also be achieved by providing an apparatus to treat a substrate comprising a processing chamber having walls to define a reaction space in which a substrate to be treated is disposed and a plasma is formed, a window plate formed as one of the walls of the processing chamber, a plurality of poles disposed on the window plate, and a connector to connect the plurality of poles.

The foregoing and/or other aspects and utilities of the present general inventive concept may also be achieved by providing an apparatus to treat a substrate comprising a processing chamber having walls and a window plate to define a reaction space, a plurality of poles disposed on the window plate, a connector to connect the plurality of poles such that induced current is generated beneath the window plate opposite to the plurality of poles when power is applied to the connector.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
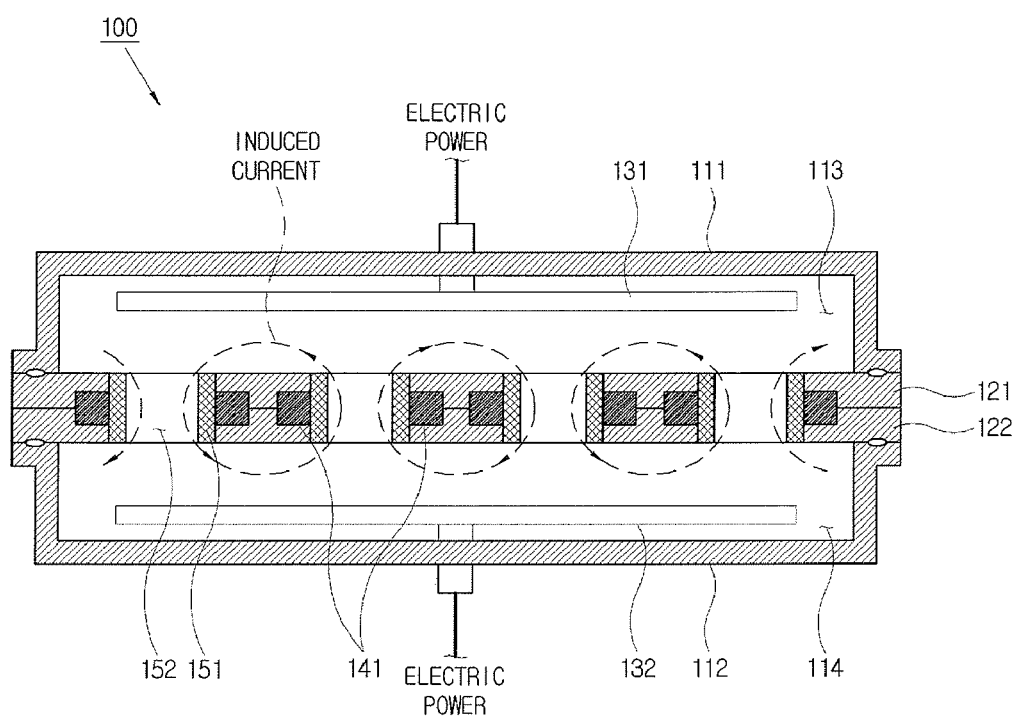
FIG. 1 is a sectional view illustrating a conventional apparatus to treat a substrate.
Figure 2:
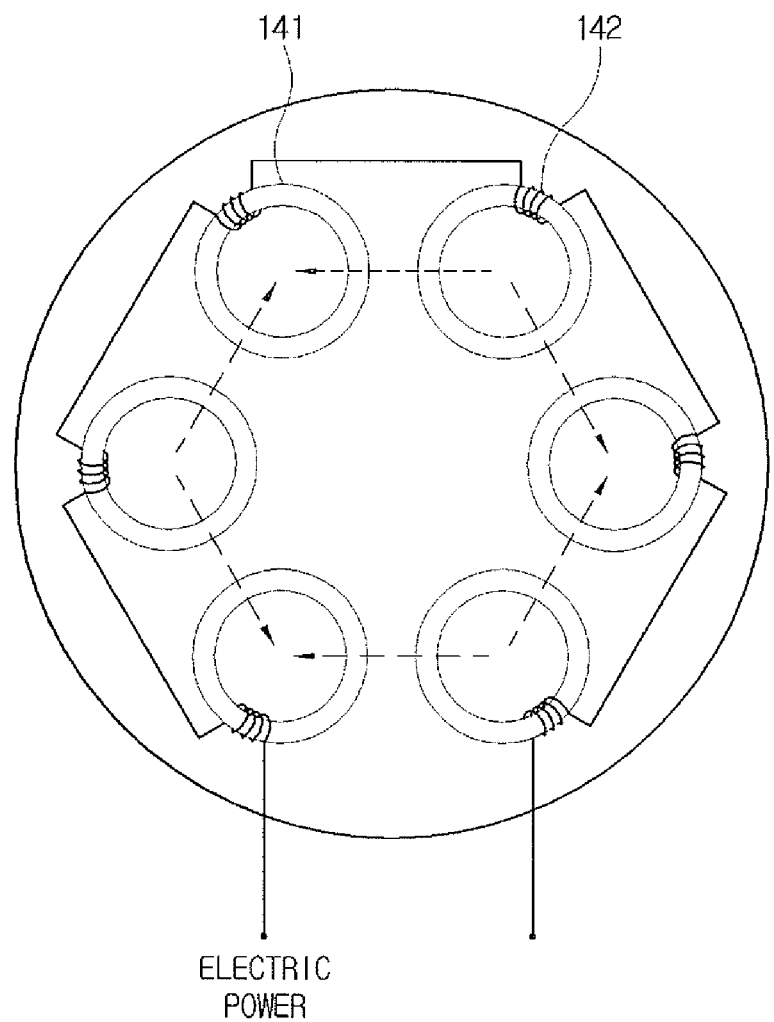
FIG. 2 is a plan view illustrating the conventional apparatus of FIG. 1.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Figure 3:
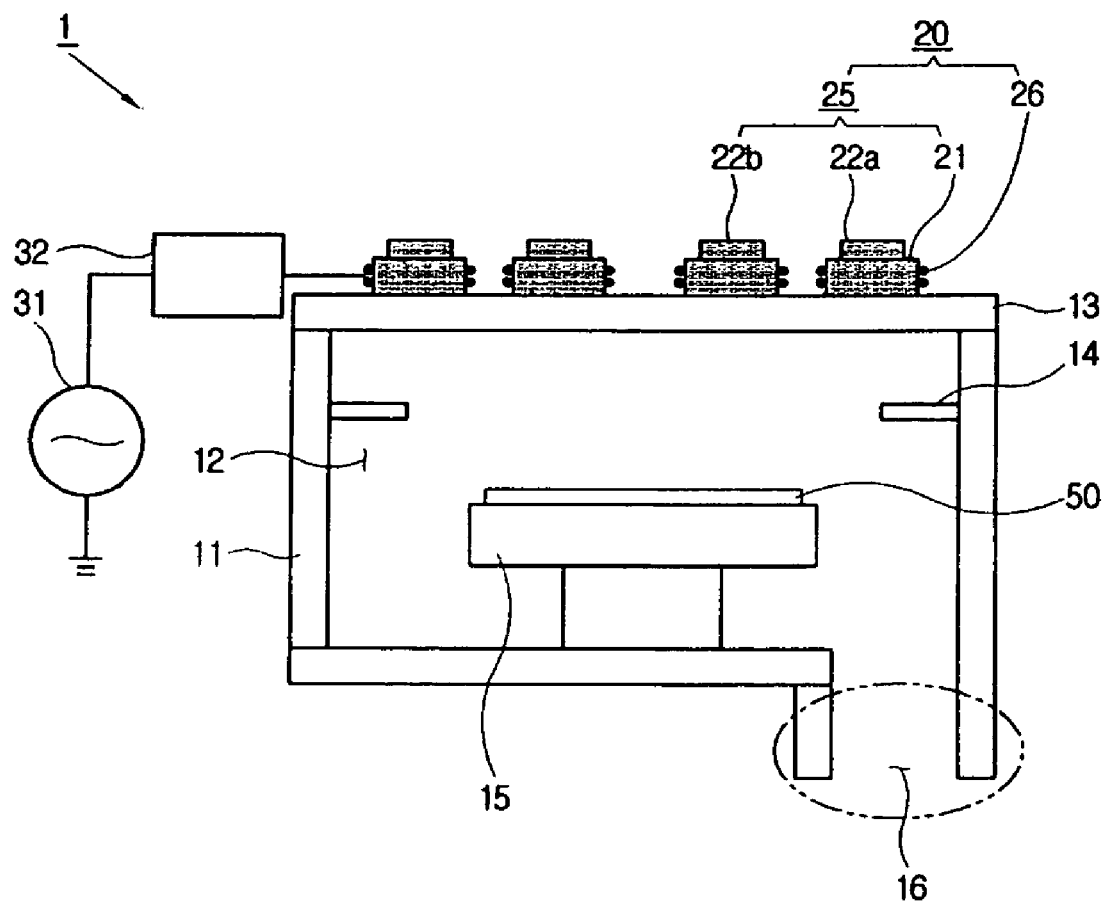
FIG. 3 is a sectional view illustrating an apparatus to treat a substrate according to an embodiment of the present general inventive concept.
Figure 4:
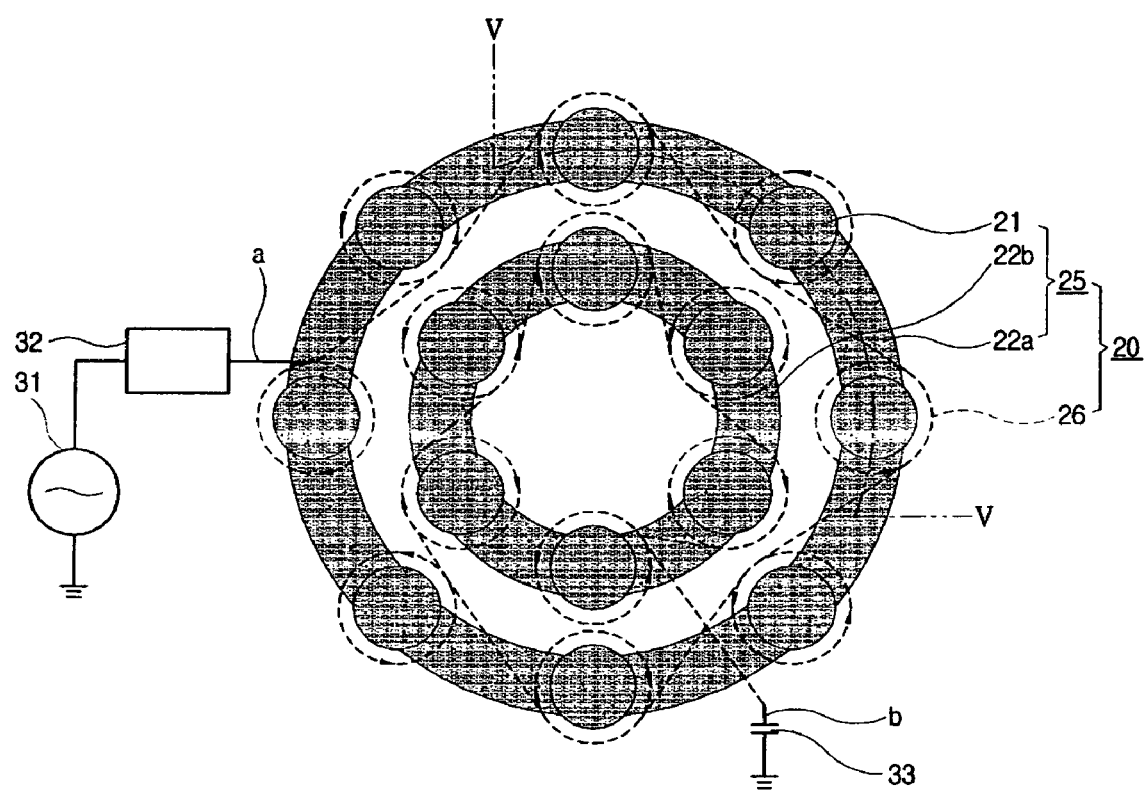
FIG. 4 is a plan view illustrating the apparatus of FIG. 3.

Referring to FIGS. 3 and 4, an apparatus to treat a substrate 1 is illustrated according to an embodiment of the present general inventive concept.

The apparatus to treat a substrate 1 comprises a reaction chamber 11 to form a reaction space 12, an antenna unit 20 disposed over the reaction space 12 and an electric power unit 31 to supply electric power to the antenna unit 20.

The reaction chamber 11 forms the reaction space 12 where plasma is formed to treat the substrate and keeps the reaction space 12 at a vacuum and at a constant temperature. A window plate 13 is provided between the reaction chamber 11 and the antenna unit 20. The window plate 13 may be formed of insulating material such as alumina or quartz. A pair of nozzles 14 is provided in a lateral wall of the reaction chamber 11 through which the reactant gas flows. A chuck 15 is disposed in the reaction space 12, on which a substrate 50 to be treated is seated. A vacuum port 16 is provided in a lower part of the reaction chamber 11 to keep the reaction space 12 at the vacuum and to discharge the reactant gas, a by-product, or the like to an outside thereof. The vacuum port 16 is connected to a vacuum pump (not shown).

The antenna unit 20 faces the reaction space 12 across the window plate 13 and comprises a ferrite core 25 and a coil 26 winding around the ferrite core 25.

The ferrite core 25 comprises a plurality of poles 21 and connectors 22a and 22b to connect the adjacent poles 21 with one another. The pole 21 contacts the window plate 13 and the connectors 22a and 22b each are disposed on the pole 21 to connect the poles 21 with one another. The inside connectors 22b are dispose inside the outside connectors 22a in a circular direction.

The connectors 22a and 22b are formed in a toroidal shape and comprise an outside connector 22a and an inside connector 22b which are disposed coaxially. The poles 21 are disposed in the connectors 22a and 22b at a regular interval in a round shape. The pole 21 is formed in a cylinder shape and has a longer diameter than the width of the connectors 22a and 22b. Each of the connectors 22a and 22b connects the even number of the poles 21, wherein the outside connector 22a connects eight poles 21 and the inside connector 22b connects six poles 21.

The connectors 22a and 22b connect the even number of the poles 21, thereby winding the coil 26 on the adjacent poles 21 in an opposite direction from another adjacent pole 21. Thus, the one of the coils 26 of the adjacent poles 21 is wound in one direction and then another one of the coils 26 of the adjacent poles 21 is wound in the other direction. An end portion of the coil 26 is connected to the electric power unit 31 and the other end portion of the coil 26 is grounded. The coil 26 sequentially winds around the poles 21 connected to the outside connector 22a, and then sequentially winds around the poles 21 connected to the inside connector 22b. The coil 26 winds around the adjacent poles 21 in the opposite direction and the even number of the poles 21 are connected to each of the connectors 22a and 22b, and accordingly the coil 26 winds around all the adjacent poles 21 in the opposite direction.

The electric power unit 31 supplies 100 kHz~1 MHz of electric power to the coil 26. An impedance matching unit 32 disposed between the electric power unit 31 and the coil 26 allows the electric power of the electric power unit 31 to be supplied to the coil 26 without loss.

The coil 26 is grounded through a capacitor 33. The capacitor 33 controls capacitance to distribute voltages to point 'a' and point 'b'. If impedance of the capacitor 33 is about a half of an absolute value of impedance by inductance of the ferrite core 25, both an input voltage and a ground voltage becomes minimized. Thus, the possibility of generating arcing is reduced and a capacitive coupling effect with the plasma decreases, thereby reducing ion loss in a sheath area of the window plate 13.

Figure 5:
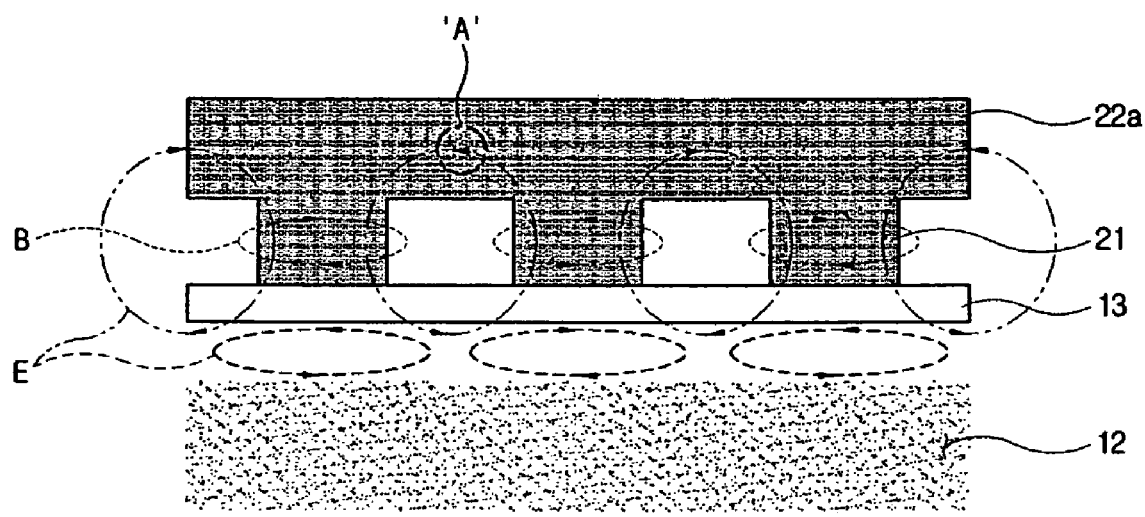
FIG. 5 is a view illustrating an induced current generated in the apparatus of FIG. 3.

Referring to FIG. 5, an induced current generated in the apparatus for treating the substrate according to the first embodiment of the present general inventive concept will be illustrated. FIG. 5 illustrates a schematic view of FIG. 4, taken along line V-V.

When the electric power unit 31 supplies the electric power to the coil 26 in order to treat the substrate, the current flowing in the coil 26 generates a magnetic field in a sine curve, thereby generating an induced electromotive force in the opposite direction of the current of coil 26 in the reaction space 12. Also, an induced current is generated in the plasma by the induced electromotive force and heats the plasma. The currents flow in each of the poles 21 in the opposite direction of the magnetic field. The substrate 50 is deposited or etched by the plasma.

In this case, a magnetic field is generated in an area ('A') through the connectors 22a and 22b between the poles 21, thereby preventing the electric power from transmitting to the upper part of the connectors 22a and 22b. Accordingly, the magnetic field is protected from loss due to external disturbances around the upper part of the connectors 22a and 22b_and the magnetic field increases in the reaction space 12, thereby improving plasma-generating efficiency.

Because the apparatus 1 to treat the substrate 50 of the present embodiment has high plasma-generating efficiency, it efficiently generates a uniform plasma even if using low-frequency electric power. As the substrate becomes larger so as to improve productivity of apparatuses using the plasma, it has been more important to generate plasma which has excellent uniformity and high density. If a plasma source is enlarged in a case that the plasma is generated with high-frequency electric power, e.g. 13.56 MHz, the plasma uniformity falls due to a transmission line effect. If the plasma is generated with a relatively low-frequency ω electric power of 100 kHz~1 MHz, the transmission line effect is eliminated, thereby producing a broad plasma source having excellent uniformity. However, since an induced electromotive force E for generating the plasma is proportional to a magnetic field B of the antenna and the frequency ω of the electric power, the plasma-generating efficiency falls if the plasma is generated with the relatively low-frequency electric power. In the present general inventive concept, the ferrite core 25 having a high magnetic permeability may be used to improve inductive coupling efficiency between the antenna 20 and the plasma, and accordingly the uniform and high density plasma may be obtained even if using the relatively low-frequency electric power.

In the apparatus 1 to treat the substrate 50 of the first embodiment, the plasma is generated only in the lower part of the antenna 20 where the substrate 50 is disposed, not in the upper part thereof where the substrate 50 is not disposed. Accordingly, the plasma-generating efficiency becomes high since all the plasma is used for treating the substrate 50 without loss.

FIGS. 6 through 10 are plan views illustrating an apparatus to treat the substrate according to embodiments of the present general inventive concept. Like reference numerals of FIG. 6 refer to like elements of FIGS. 3-5.

Figure 6:
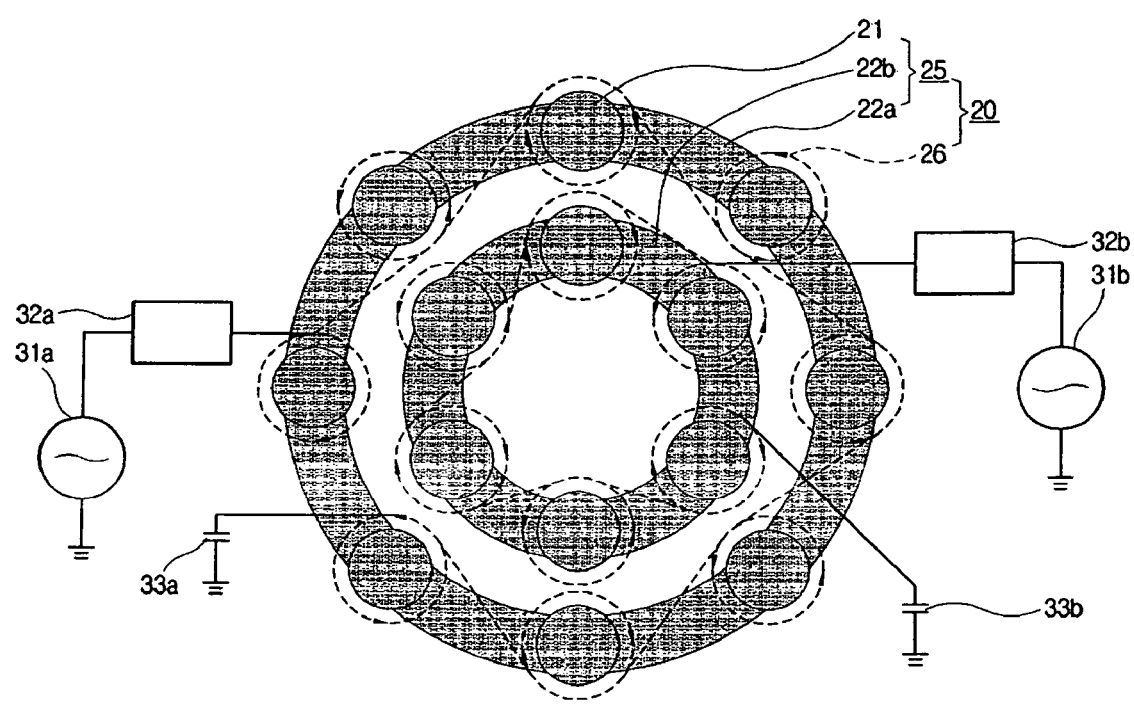
FIGS. 6 through 10 are plan views illustrating an apparatus to treat a substrate according to embodiments of the present general inventive concept.

Referring to FIG. 6, coils 26 independently wind around poles 21 connected to an outside connector 22a and poles 21 connected to an inside connector. The respective coils 26 are connected to separate electric power units 31a and 31b and capacitors 33a and 33b. The respective electric power units 31a and 31b supply different frequencies of electric power, for example, one of the electric power units 31a, 31b may supply a high-frequency electric power of 13.56 MHz and the other one of the electric power units 31a and 31b may supply a relatively low-frequency electric power of 100 kHz~1 MHz.

Figure 7:
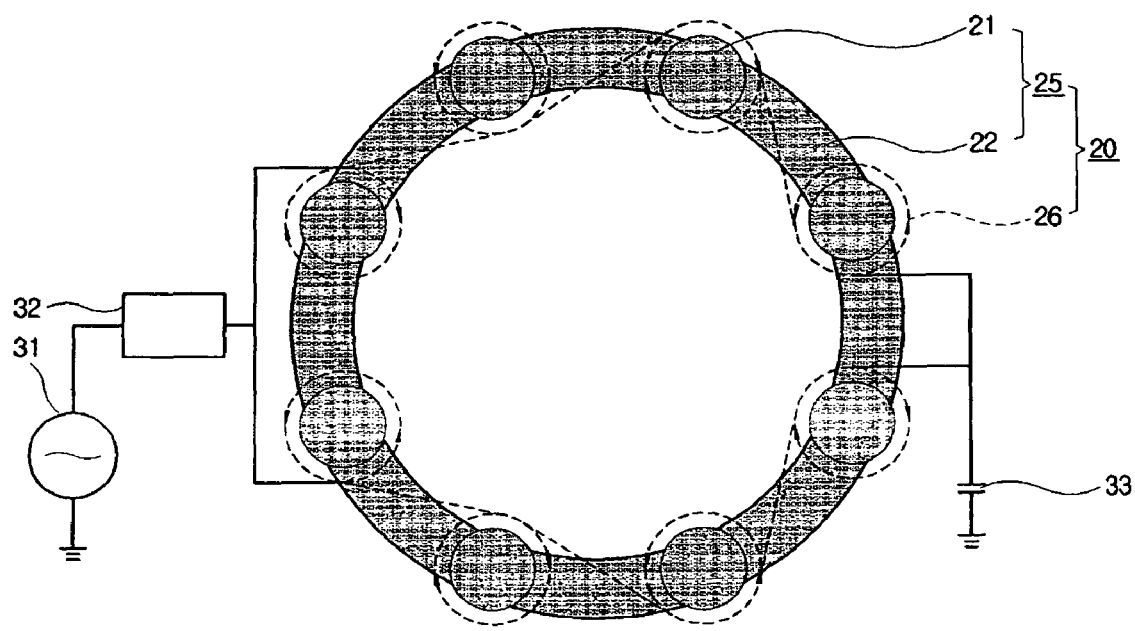

Referring to FIG. 7, there is provided a single connector 22 according to the third embodiment of the present general inventive concept. A coil 26 is divided into two parts, thereby being supplied with electric power from an electric power unit 31 in parallel. Thus, if the coil 26 is divided into two parts in parallel, inductance of an antenna 20 becomes about one-fourth of one in series. If the inductance of the antenna 20 decreases, voltage of the antenna 20 is reduced, thereby decreasing the possibility of generating arcing.

The pole 21 in the first embodiment through the third embodiment is of a cylinder shape with a constant diameter and the diameter is larger than the width of the connectors 22, 22a and 22b. The shape and the diameter of the pole 21 may change as necessary. The pole 21 may be formed in a triangular prism or a square pillar, or a triangular prism along with a square pillar. The diameter of the pole 21 may be smaller than the width of the connectors 22, 22a and 22b or the respective poles 21 may have different diameters. The shape and size of the pole 21 are adjusted considering plasma uniformity.

Figure 8:
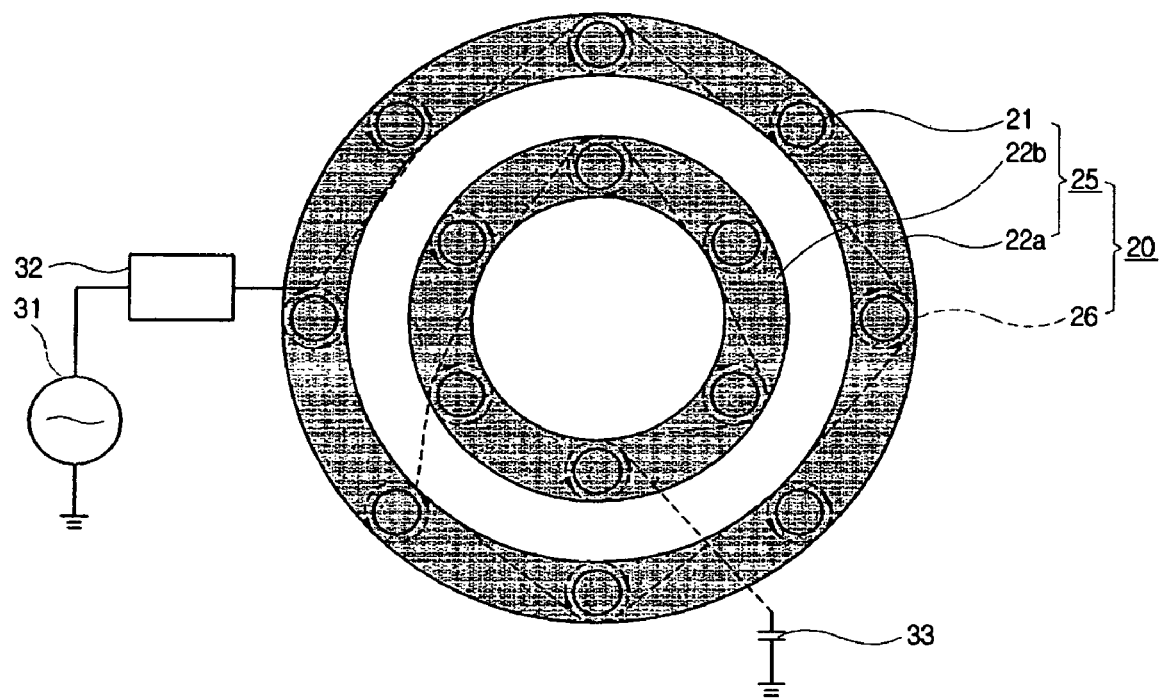

Referring to FIG. 8, embodiments of FIGS. 3-8, the diameter of a pole 21 is smaller than the width of connectors 22a and 22b in the fourth embodiment. A coil 26 winding around the pole 21 is connected to a single electric power unit 31.

Connectors 22, 22a and 22b of the embodiments of FIGS. 3-8 are of a toroidal shape, i.e., a round loop, but they are not limited to the toroidal shape. The connectors 22, 22a and 22b may be formed in a square loop, a triangle loop, or a square loop along with a triangle loop. The shape of connectors 22, 22a and 22b may be adjusted according to plasma uniformity.

Figure 9:
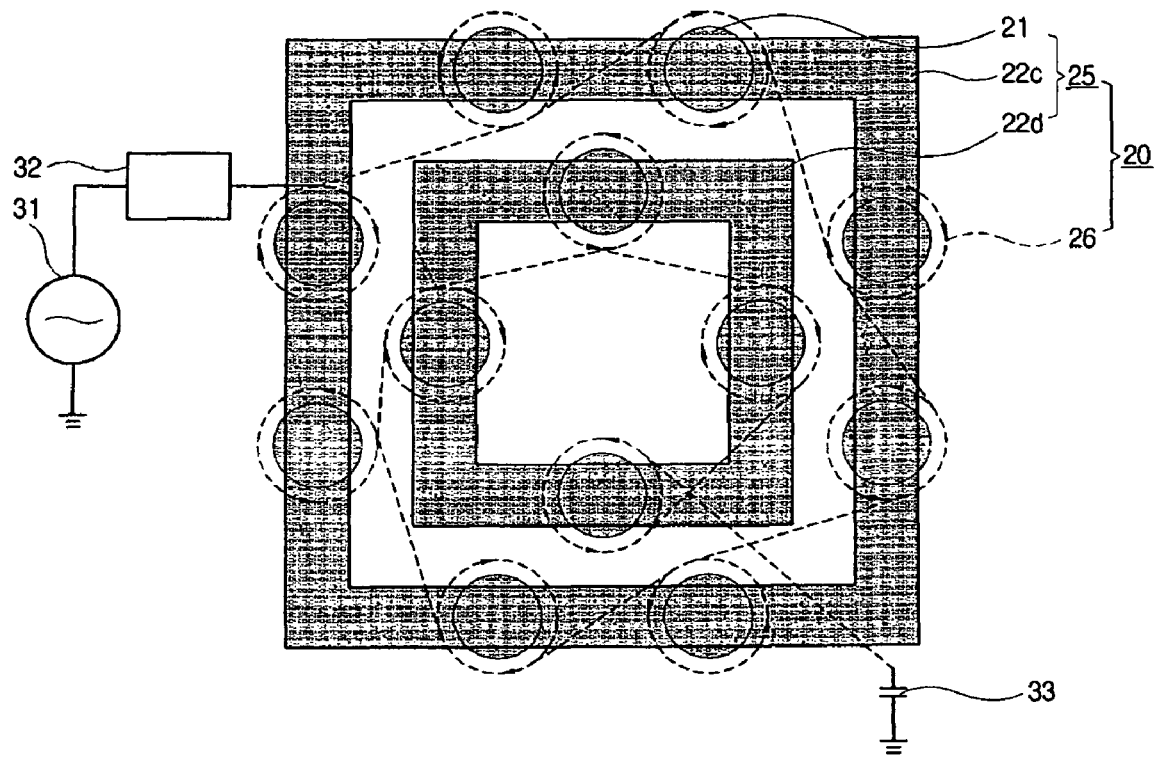

Referring to FIG. 9, connectors 22c and 22d are formed in a square shape. Each of the connectors 22c and 22d connects the even number of poles 21. A coil 26 winding around the pole 21 is connected to a single electric power unit 31.

In the embodiments of FIGS. 3-9, the connectors 22, 22a, 22b, 22c and 22d are formed in a closed curved line, but the connectors 22, 22a, 22b, 22c, and 22d are not limited to the closed curved line. The connectors 22, 22a, 22b, 22c and 22d may be formed in a straight line or a curved line, or a combination thereof. The shape of the connectors 22, 22a, 22b, 22c and 22d may be adjusted according to plasma uniformity.

Figure 10:
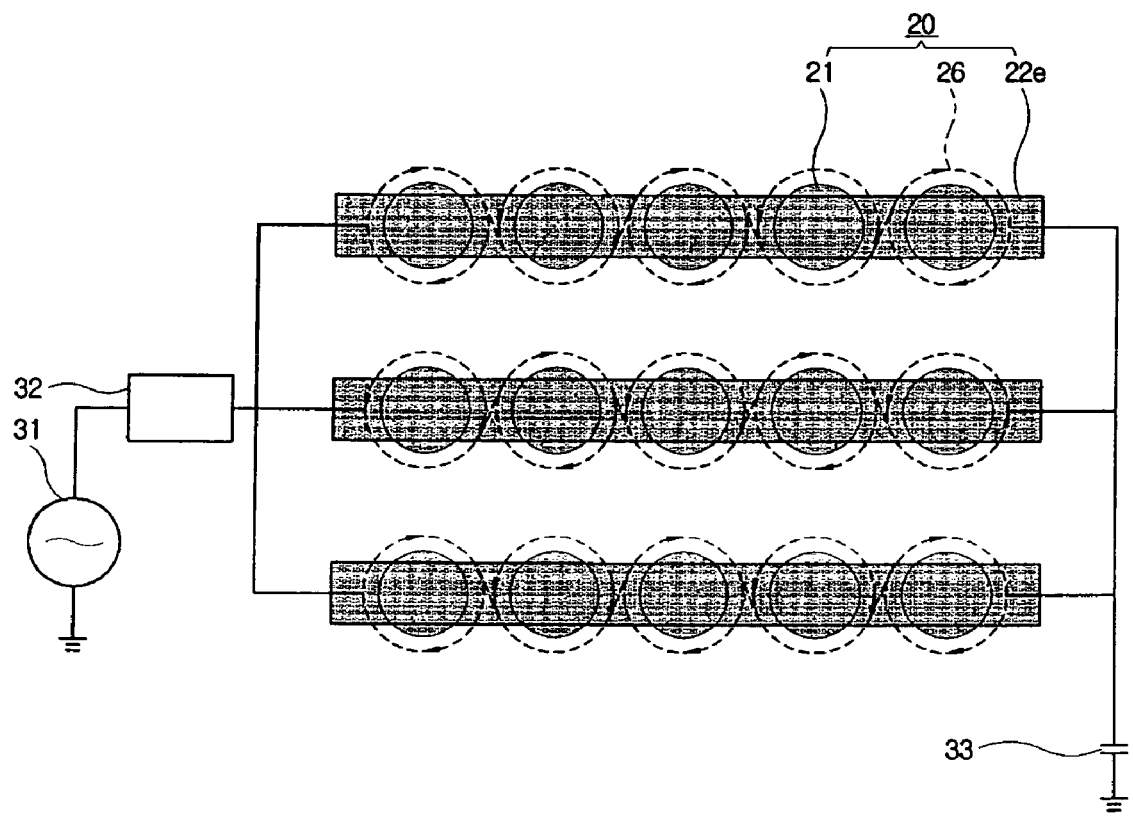

Referring to FIG. 10, unlike embodiments of FIGS. 3-9, three connectors 22e in a straight line are disposed parallel with one another. The respective connectors 22e connect five poles 21. The number of poles 21 should not be even since the connector 22e is not formed in a closed loop. A coil 26 is connected to each connector 22e in parallel, thereby reducing the possibility of generating arcing.

The apparatus to treat the substrate according to the present embodiment may be used to deposit a thin film onto a substrate or to etch the thin film on the substrate. A substrate for a display apparatus, e.g., a liquid crystal display or an organic light emitting diode, or a semiconductor wafer may be treated with the apparatus according to the present general inventive concept.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An apparatus to treat a substrate, comprising:
a processing chamber comprising a reaction space where a substrate to be treated is disposed and a plasma is formed;
a ferrite core comprising a plurality of poles disposed outside the reaction space and a ferrite connector to face the reaction space across the plurality of poles and to connect the plurality of the poles to each other such that each of the poles is configured to be adjacent to two opposing poles;
a coil to wind around the plurality of poles; and
an electric power unit to supply electric power to the coil, wherein the connector is disposed in a toroidal shape.

2. The apparatus according to claim 1, wherein the coil winds around the adjacent poles in the opposite direction.

3. The apparatus according to claim 1, wherein the connector is formed in a closed loop.

4. The apparatus according to claim 3, wherein the plurality of poles connected to each other by the connector are disposed in a round shape.

5. The apparatus according to claim 3, wherein the plurality of poles connected to each other by the connector are disposed at a predetermined distance.

6. The apparatus according to claim 3, wherein the number of poles connected to each other by the connector is an even number.

7. The apparatus according to claim 3, wherein the connector is disposed in a round shape.

8. The apparatus according to claim 3, wherein the connector comprises an inside connector and an outside connector surrounding the inside connector.

9. The apparatus according to claim 8, wherein the inside connector and the outside connector are disposed coaxially in a round shape.

10. The apparatus according to claim 8, wherein the electric power unit supplies electric power to the inside connector and the outside connector independently.

11. The apparatus according to claim 10, wherein the electric power unit supplies 100 kHz~1 MHz of electric power to one of the inside connector and the outside connector.

12. The apparatus according to claim 8, wherein the connectors are disposed in a toroidal shape.

13. The apparatus according to claim 3, wherein the coil is divided into two parts, and the two parts are connected to the electric power unit in parallel.

14. The apparatus according to claim 1, wherein the poles has a cylinder shape.

15. The apparatus according to claim 1, wherein the electric power unit supplies 100 kHz~1 MHz of electric power.

16. The apparatus according to claim 1, wherein the coil is grounded through a capacitor.

17. The apparatus according to claim 16, wherein impedance of the capacitor is about a half of impedance of the ferrite core.

18. The apparatus according to claim 1, further comprising: a window plate disposed between the reaction space and the ferrite core.

19. The apparatus according to claim 18, wherein the window plate is alumina or quartz.

20. The apparatus according to claim 1, further comprising: an impedance matching unit disposed between the electric power unit and the coil.

21. An apparatus to treat a substrate using plasma, comprising:
   a processing chamber having walls to define a reaction space in which a substrate to be treated is disposed and plasma is formed;
   a window plate formed as one of the walls of the processing chamber;
   a plurality of poles disposed on the window plate;
   a ferrite connector to connect the plurality of poles such that each of the poles is configured to be adjacent to two opposing poles; and
   a coil wound around the plurality of poles,
   wherein the connector is disposed in a toroidal shape.

22. The apparatus according to claim 21, wherein the plurality of poles comprises a first group of poles and a second group of poles disposed inside the first group.

23. The apparatus according to claim 22, wherein the connector electrically connects the first group of poles and the second group of poles.

24. The apparatus according to claim 22, wherein the coil is wound around each of the plurality of poles in alternating directions.

25. An apparatus to treat a substrate, comprising:
   a processing chamber having walls and a window plate to define a reaction space;
   a plurality of poles disposed on the window plate;
   a coil wound around the plurality of poles; and
   a ferrite connector to connect the plurality of poles such that each of the poles is configured to be adjacent to two opposing poles and induced current is generated beneath the window plate opposite to the plurality of poles when power is applied to the connector,
   wherein the connector is disposed in a toroidal shape.

* * * * *